United States Patent
Takenaka et al.

(10) Patent No.: US 7,491,960 B2
(45) Date of Patent: Feb. 17, 2009

(54) RADIOGRAPHIC APPARATUS AND CONTROL METHOD THEREFOR

(75) Inventors: Katsuro Takenaka, Kodama-gun (JP); Tadao Endo, Honjyo (JP); Tomoyuki Yagi, Chohu (JP); Toshio Kameshima, Kumagaya (JP)

(73) Assignee: Canon Kabushiki Kaisha, Tokyo (JP)

( * ) Notice: Subject to any disclaimer, the term of this patent is extended or adjusted under 35 U.S.C. 154(b) by 139 days.

(21) Appl. No.: 11/079,504

(22) Filed: Mar. 11, 2005

(65) Prior Publication Data
US 2005/0199834 A1    Sep. 15, 2005

(30) Foreign Application Priority Data
Mar. 12, 2004  (JP)  ............................. 2004-071171

(51) Int. Cl.
  *G01N 23/04*  (2006.01)
(52) U.S. Cl. .................................................. 250/580
(58) Field of Classification Search ................... 250/580
  See application file for complete search history.

(56) References Cited

U.S. PATENT DOCUMENTS

| | | | |
|---|---|---|---|
| 5,591,963 A * | 1/1997 | Takeda et al. ............ | 250/214.1 |
| 6,046,446 A * | 4/2000 | Kameshima et al. ...... | 250/214.1 |
| 6,075,256 A | 6/2000 | Kaifu et al. ............... | 257/53 |
| 6,952,015 B2 | 10/2005 | Kameshima ............ | 250/370.11 |
| 6,952,464 B2 | 10/2005 | Endo ......................... | 378/98.11 |
| 7,129,499 B2 * | 10/2006 | Nokita ..................... | 250/370.09 |
| 2002/0063199 A1 * | 5/2002 | Kozuka .................... | 250/214.1 |
| 2003/0213914 A1 * | 11/2003 | Kobayashi et al. ...... | 250/370.09 |
| 2005/0109927 A1 | 5/2005 | Takenaka et al. ......... | 250/252.1 |
| 2005/0173645 A1 | 8/2005 | Endo ...................... | 250/370.11 |
| 2005/0200720 A1 | 9/2005 | Kameshima et al. ..... | 348/220.1 |
| 2005/0218333 A1 | 10/2005 | Kameshima ........... | 250/370.11 |
| 2005/0220269 A1 | 10/2005 | Endo et al. .................. | 378/114 |
| 2005/0220270 A1 | 10/2005 | Kameshima et al. ........ | 378/116 |

FOREIGN PATENT DOCUMENTS

JP    2002-305687 A    10/2002

* cited by examiner

*Primary Examiner*—David P Porta
*Assistant Examiner*—Carolyn Igyarto
(74) *Attorney, Agent, or Firm*—Fitzpatrick, Cella, Harper & Scinto

(57) ABSTRACT

If image data is input to an image processor (step S1), the image processor generates an integrated image sum (step S2). The image processor extracts a maximum output max from the integrated image sum (step S3). The image processor compares the maximum output max with a preset threshold (step S4). In this case, the threshold is set to 80% of the saturation amount. When the saturation amount is 3 V, the threshold is 2.4 V. If the maximum value max is smaller than the threshold, imaging continues. If the maximum value max is equal to or larger than the threshold, the integrated image sum is cleared to 0 (step S5), and a refresh operation is performed.

13 Claims, 14 Drawing Sheets

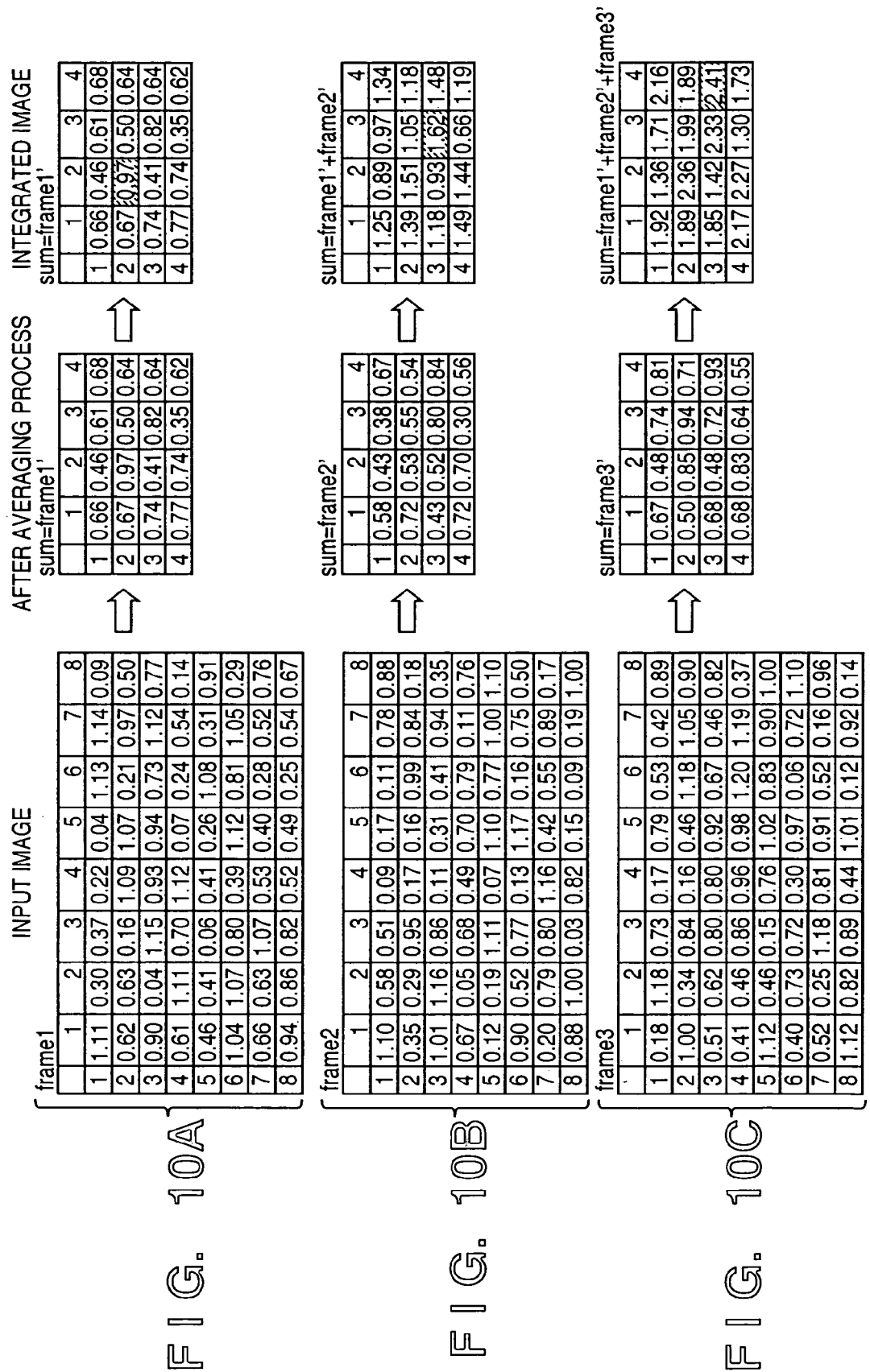

REFRESH MODE

PHOTOELECTRIC
CONVERSION
MODE

SATURATION STATE

RADIOGRAPHIC APPARATUS AND CONTROL METHOD THEREFOR

FIELD OF THE INVENTION

The present invention relates to a radiographic apparatus suitable for an X-ray imaging apparatus and a control method therefor.

BACKGROUND OF THE INVENTION

Conventional X-ray imaging systems installed in a hospital and the like are classified into a film radiography type in which a patient is irradiated with X-rays and a film is exposed to X-rays having passed through the patient, and an image processing type in which X-rays having passed through a patient are converted into an electrical signal and the signal undergoes a digital image process.

One of image processing systems is a radiographic apparatus which includes a phosphor for converting X-rays into visible light and a photoelectric conversion device for converting visible light into an electrical signal. X-rays having passed through a patient irradiate the phosphor, and internal information of the patient that is converted into visible light by the phosphor is output as an electrical signal from the photoelectric conversion device. The information can be digitized by an A/D converter after conversion into an electrical signal, and the X-ray image information subjected to recording, display, printing, diagnosis, and the like can be processed as a digital value.

Recently, a radiographic apparatus using an amorphous silicon semiconductor thin film for the photoelectric conversion device has come into practical use (see Japanese Patent Laid-Open No. 2002-305687).

FIG. 12 is a plan view showing a conventional photoelectric conversion substrate constituted by using an amorphous silicon semiconductor thin film as the materials of a MIS photoelectric conversion device and switching device. FIG. 12 also illustrates wiring lines which connect these devices. FIG. 13 is a sectional view taken along the line I-I in FIG. 12. In the following description, the MIS photoelectric conversion device will be simply called a photoelectric conversion device for convenience.

Photoelectric conversion devices 101 and switching devices 102 (amorphous silicon TFTs: to be simply referred to as TFTs hereinafter) are formed on a single substrate 103. The lower electrodes of the photoelectric conversion devices share first metal thin film layers 104 with the lower electrodes (gate electrodes) of the TFTs. The upper electrodes of the photoelectric conversion devices share second metal thin film layers 105 with the upper electrodes (source and drain electrodes) of the TFTS. The first and second metal thin film layers also serve as gate driving wiring lines 106 and matrix signal wiring lines 107 within the photoelectric conversion circuit unit. In FIG. 12, the number of pixels is 2×2=4. A hatched portion in FIG. 12 is the light-receiving surface of the photoelectric conversion device. Reference numeral 109 denotes a power supply line which biases the photoelectric conversion device. Reference numeral 110 denotes a contact hole for connecting the photoelectric conversion device and TFT.

With the structure as shown in FIG. 12 in which an amorphous silicon semiconductor is the main material, photoelectric conversion devices, switching devices, gate driving wiring lines, and matrix signal wiring lines can be simultaneously fabricated on the same substrate. This can easily provide a large-area photoelectric conversion circuit unit at low cost.

Device operation of a single photoelectric conversion device will be explained. FIGS. 14A to 14C are energy band diagrams for explaining device operation of the photoelectric conversion device shown in FIGS. 12 and 13. Depending on how voltage is applied to the first and second metal thin film layers 104 and 105, the photoelectric conversion device has two operation modes: a refresh mode and photoelectric conversion mode.

FIGS. 14A and 14B show operations in the refresh mode and photoelectric conversion mode, respectively, and illustrate the states of the layers in FIG. 13 in the direction of film thickness. Reference symbol M1 denotes a lower electrode (G electrode) formed from the first metal thin film layer 104 (e.g., Cr). An amorphous silicon nitride (a-SiNx) layer 111 is an insulating layer which blocks passage of both electrons and holes. The a-SiNx layer 111 must be thick enough not to cause the tunnel effect, and is generally set to 500 Å or more. An amorphous silicon hydride (a-Si:H) layer 112 is a photoelectric conversion semiconductor layer formed from an intrinsic semiconductor layer (i layer) in which no dopant is intentionally doped. An $N^+$ layer 113 is an injection blocking layer against a carrier of one conductivity type that is formed from a non-single crystal semiconductor (e.g., N-type a-Si:H layer) in order to block injection of holes into the a-Si:H layer 112. Reference symbol M2 denotes an upper electrode (D electrode) formed from the second metal thin film layer 105 (e.g., Al).

In FIG. 12, the D electrode does not completely cover the $N^+$ layer. The D electrode and $N^+$ layer are always at the same potential because electrons freely move between the D electrode and the $N^+$ layer. The following description is based on this.

In FIG. 14A showing the refresh mode, a negative potential is applied to the D electrode with respect to the G electrode. Holes (•) in the i layer (a-Si:H) are guided to the D electrode by the electric field. At the same time, electrons (○) are injected into the i layer. At this time, some holes and some electrons recombine with each other and disappear in the $N^+$ layer or i layer. If this state continues for a sufficiently long time, holes in the i layer are swept from the i layer.

In order to change from this state to the state of FIG. 14B showing the photoelectric conversion mode, a positive potential is applied to the D electrode with respect to the G electrode. Then, electrons in the i layer are instantaneously guided to the D electrode. However, holes are not guided to the i layer because the $N^+$ layer functions as an injection blocking layer. If light enters the i layer in this state, light is absorbed by the i layer to create electron-hole pairs. Electrons are guided to the D electrode by the electric field, whereas holes move in the i layer and reach the interface between the i layer and the a-SiNx insulating layer. At this time, holes cannot move into the a-SiNx insulating layer, and stay in the i layer. Since electrons move to the D electrode and holes move to the interface between the i layer and the insulating layer, a current flows from the G electrode in order to keep electroneutrality in the photoelectric conversion device. The magnitude of current corresponds to electron-hole pairs created upon incidence of light, and is proportional to the quantity of incident light.

After the state in FIG. 14B showing the photoelectric conversion mode is maintained for a predetermined period, the state changes to that of FIG. 14A showing the refresh mode again. Then, holes staying in the i layer are guided to the D electrode, as described above, and at the same time a current corresponding to holes flows. The number of holes corresponds to the total quantity of light applied during the period of the photoelectric conversion mode. At this time, a current corresponding to the number of electrons injected into the i layer also flows, but the number of electrons is almost constant, and the current can be detected by subtracting the number of electrons. That is, the photoelectric conversion device can output the quantity of incident light in real time, and can also detect the total quantity of light applied during a given period.

However, when the period of the photoelectric conversion mode becomes long for whatever reason or the illuminance of incident light is strong, no current may flown, regardless of the incidence of light. This is because many holes stay in the i layer in the photoelectric conversion mode and reduce the electric field within the i layer, and created electrons are not guided to the D electrode and recombine with holes within the i layer, as shown in FIG. 14C. This state is called the saturation state of the photoelectric conversion device, if the incident state of light changes in this state, current may flow, but unstably. However, holes in the i layer are swept in the refresh mode again, and a current proportional to light flows again in the next photoelectric conversion mode.

In X-ray imaging using the conventional radiographic apparatus, the photoelectric conversion device is set in the refresh mode to perform refresh operation. Then, the photoelectric conversion device is set in the photoelectric conversion mode and irradiated with X-rays to perform read operation, acquiring one still image. In order to acquire successive moving images, the series of processes is repeated by the number of moving images to be acquired.

After refresh operation, X-ray irradiation must wait until voltage fluctuations by the refresh stabilize. In general, specifications necessary for imaging of a chest are an imaging region of 40 cm square or more and a pixel pitch of 200 μm or less. When the radiographic apparatus is fabricated at an imaging region of 40 cm square and a pixel pitch of 200 μm, the number of photoelectric conversion devices increases to 4,000,000. Refreshing so many pixels increase the current flowing during refresh operation, and voltage fluctuations in GND and the power supply line of the X-ray imaging apparatus become large. In other words, the wait time after the refresh operation becomes longer for a larger number of pixels.

To acquire moving images by using the conventional radiographic apparatus, refresh operation must be executed after each imaging operation, as described above. As the number of pixels increases or the number of imaging operations increases, the time taken for refresh and the wait time accompanying refresh become longer, decreasing the frame frequency.

SUMMARY OF THE INVENTION

It is an object of the present invention to provide a radiographic apparatus capable of shortening the refresh time and the wait time after refresh and increasing the frame frequency, and a control method therefor.

The present inventors made extensive studies to solve the above problems, and have found out the following aspects of the present invention.

A radiographic apparatus according to the present invention comprises a photoelectric conversion device array in which a plurality of pixels are arrayed on a substrate, wherein each of the pixels includes at least a photoelectric conversion device, and where the photoelectric conversion device can be reset in a reset operation, can be initialized in a refresh opera-tion and can generate a signal in a photoelectric conversion operation; and a processor configured to determine whether to perform a refresh operation on the basis of the image data acquired by signals output from the photoelectric conversion device array, and either does or does not perform a refresh operation after photoelectric conversion operation, in accordance with the determination. A reset operation, however, is performed after the photoelectric conversion operation regardless of whether the refresh operation is performed or not.

A radiographic system according to the present invention comprises a radiation source which irradiates an object with radiation, the above-described radiographic apparatus that detects radiation that has passed through the object, an image processing unit for performing an image process for a signal output from the radiographic apparatus and a display unit for displaying image data processed by the image processing unit.

According to the present invention, a method of controlling a radiographic apparatus having a photoelectric conversion device away in which a plurality of pixels are arrayed on a substrate, where each of the pixels includes at least a photoelectric conversion device, and where the photoelectric conversion device can be reset in a reset operation, can be initialized in a refresh operation and can generate a signal in a photoelectric conversion operation. The method comprises determining whether to perform a refresh operation on the basis of the image data acquired by signals output from the photoelectric conversion device array, and either performing or not performing a refresh operation after photoelectric conversion operation, in accordance with the determination. A reset operation, however, is performed after the photoelectric conversion operation regardless of whether the refresh operation is performed or not.

According to the present invention, a computer-readable storage medium stores a computer program for causing a computer to control a radiographic apparatus having a photoelectric conversion device away in which a plurality of pixels are arrayed on a substrate, where each of the pixels includes at least a photoelectric conversion device, and wherein said photoelectric conversion device can be reset in a reset operation, can be initialized in a refresh operation and can generate a signal in a photoelectric conversion operation, and wherein the program causes the computer to perform the above method.

According to the present invention, refresh operation need not be unnecessarily executed, and the number of refresh operations can be reduced. The time taken for a refresh operation and the wait time necessary after a refresh operation can thus be saved, and imaging of moving images at a high frame frequency can be realized.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 10A to 10C are tables showing an example of image data input to the image processor 204 and the progress of the process in the second embodiment;

DETAILED DESCRIPTION OF THE PREFERRED EMBODIMENTS

Preferred embodiments of the present invention will be described in detail below with reference to the accompanying drawings.

First Embodiment

Figure 1:
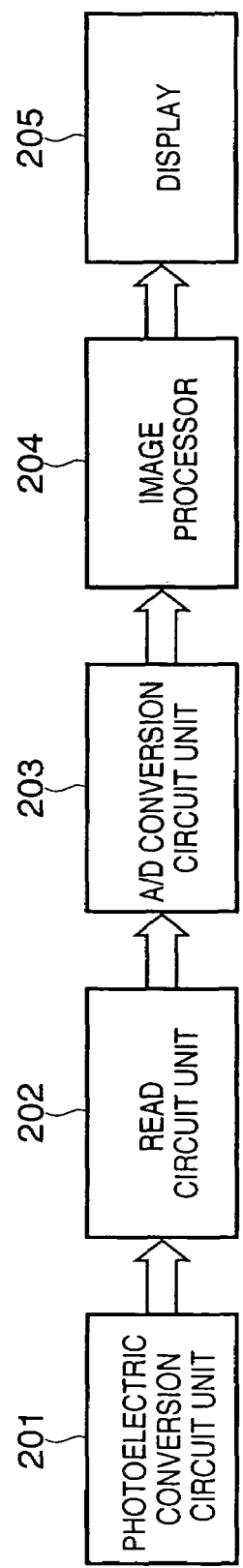
FIG. 1 is a block diagram showing the arrangement of an X-ray imaging apparatus (radiographic apparatus) and the flow of image data according to the first embodiment of the present invention.

The first embodiment of the present invention will be explained. FIG. 1 is a block diagram showing the arrangement of an X-ray imaging apparatus (radiographic apparatus) and the flow of image data according to the first embodiment of the present invention.

The first embodiment comprises a photoelectric conversion circuit unit 201, read circuit unit 202, A/D conversion circuit unit 203, image processor 204, and display 205. Image data output from the photoelectric conversion circuit unit 201 is amplified by the read circuit unit 202, and A/D-converted by the A/D conversion circuit unit 203. The data undergoes image processes such as offset correction and gamma correction by the image processor 204, and is output to the display 205. The resultant data is used for diagnosis by the radiographer.

Figure 2:
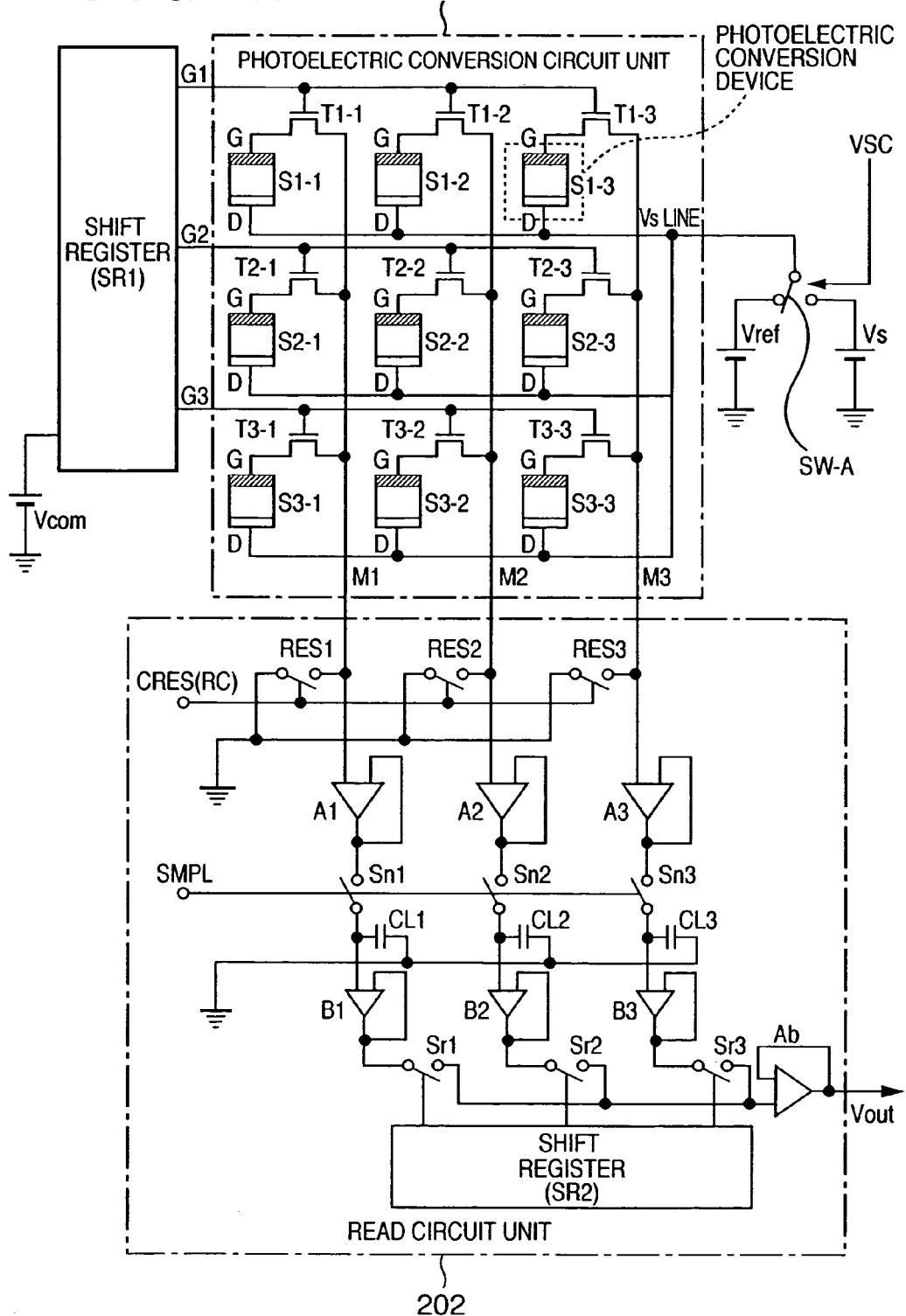
FIG. 2 is a circuit diagram showing the two-dimensional arrangements of a photoelectric conversion circuit unit 201 and read circuit unit 202.

The photoelectric conversion circuit unit 201 and read circuit unit 202 will be explained. FIG. 2 is a circuit diagram showing the two-dimensional arrangements of the photoelectric conversion circuit unit 201 and read circuit unit 202. For descriptive convenience, 3×3=9 pixels are illustrated.

In FIG. 2, reference symbols S1-1 to S3-3 denote photoelectric conversion devices; T1-1 to T3-3, switching devices (TFTs: Thin Film Transistors); G1 to G3, gate wiring lines for turning on/off the TFTs; and M1 to M3, signal wiring lines. Vs lines are wiring lines for applying a storage bias to the photoelectric conversion devices. The cross-hatched electrodes of the photoelectric conversion devices S1-1 to S3-3 are G electrodes, and the opposing electrodes are D electrodes. The D electrodes are connected to some of the Vs lines. In order to apply light onto the photoelectric conversion device, for example, a thin $N^+$ layer is used as the D electrode. In the first embodiment, the photoelectric conversion devices S1-1 to S3-3, switching devices T1-1 to T3-3, gate wiring lines G1 to G3, signal wiring lines M1 to M3, and Vs lines are included in the photoelectric conversion circuit unit 201. The Vs line is biased by a power supply Vs. Reference symbol SR1 denotes a shift register which applies a driving pulse voltage to the gate wiring lines G1 to G3. A voltage Vcom for turning on the TFT is externally applied. A control signal VSC applies two types of biases to the Vs line of the photoelectric conversion device, i.e., the D electrode of the photoelectric conversion device. The D electrode changes to Vref (V) for the control signal VSC="Hi" and Vs (V) for the control signal VSC="Lo". A read power supply Vs (V) and refresh power supply Vref (V) are DC power supplies, and for example, Vs is 9 V and Vref is 3 V.

The read circuit unit 202 amplifies, serially converts, and outputs the parallel signal outputs of the signal wiring lines M1 to M3 within the photoelectric conversion circuit unit. Reference symbols RES1 to RES3 denote switches which reset the signal wiring lines M1 to M3; A1 to A3, amplifiers which amplify the signals of the signal wiring lines M1 to M3; CL1 to CL3, sample-and-hold capacitances which temporarily store signals amplified by the amplifiers A1 to A3; Sn1 to Sn3, switches for the sample-and-hold operation; B1 to B3, buffer amplifiers; Sr1 to Sr3, switches which serially convert parallel signals; SR2, a shift register which supplies a pulse for serial conversion to the switches Sr1 to Sr3; and Ab, a buffer amplifier which outputs serially converted signals.

Figure 3:
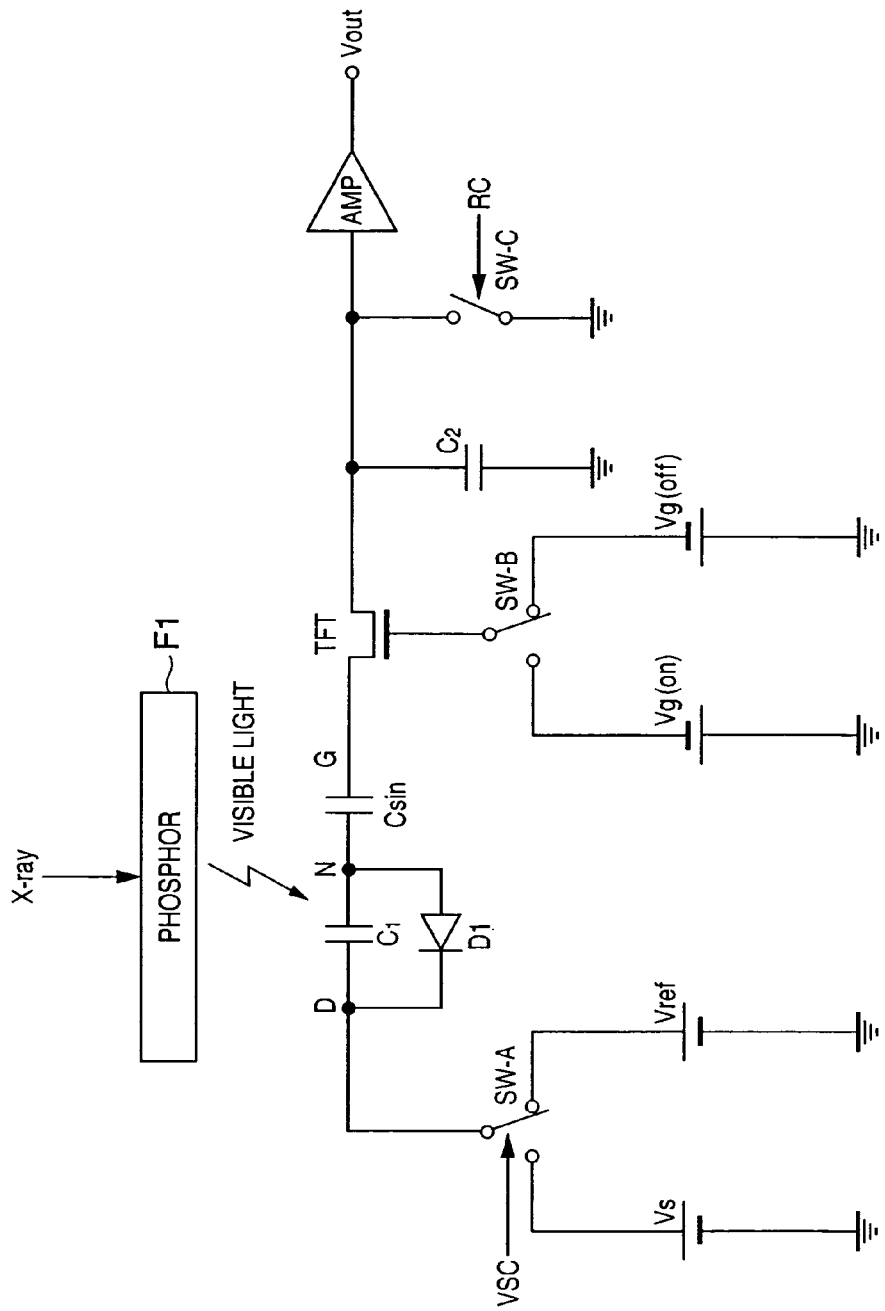
FIG. 3 is an equivalent circuit diagram showing the arrangement of one pixel of the X-ray imaging apparatus according to the first embodiment of the present invention.
Figure 12:
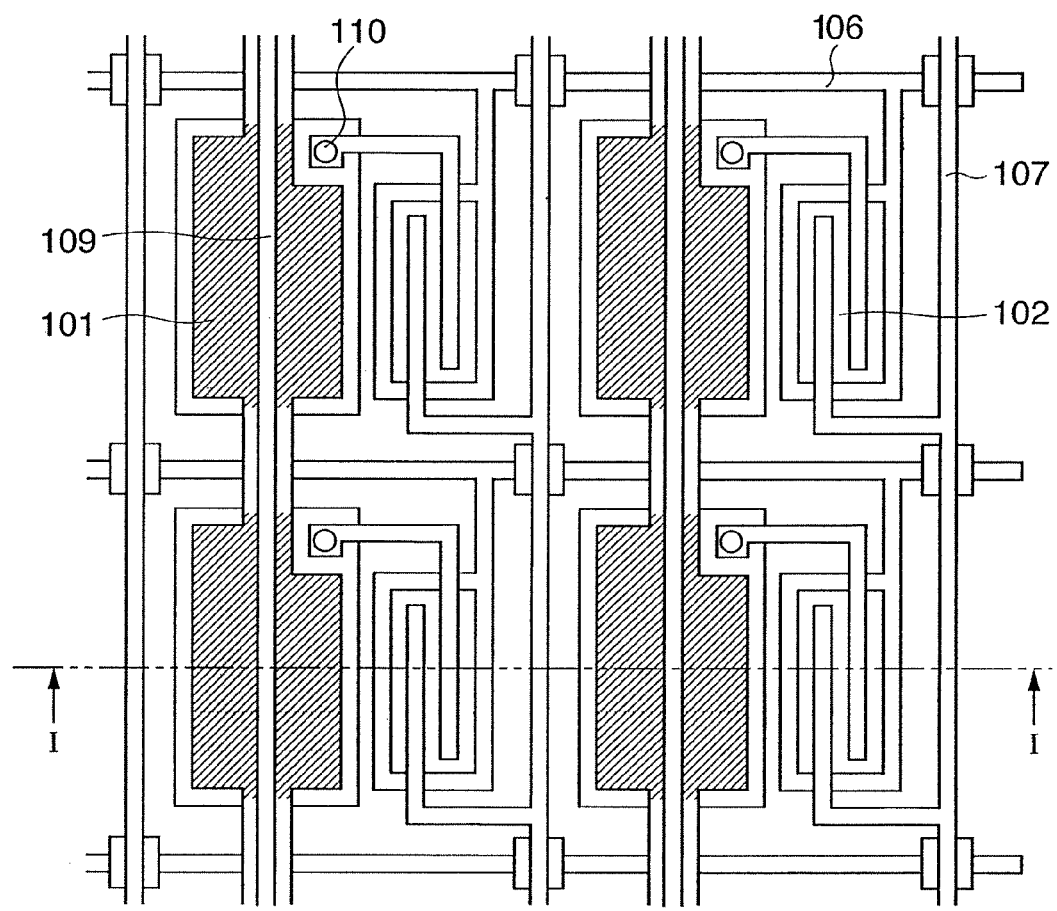
FIG. 12 is a plan view showing a conventional photoelectric conversion substrate constituted by using an amorphous silicon semiconductor thin film as the materials of a MIS photoelectric conversion device and switching device.
Figure 13:
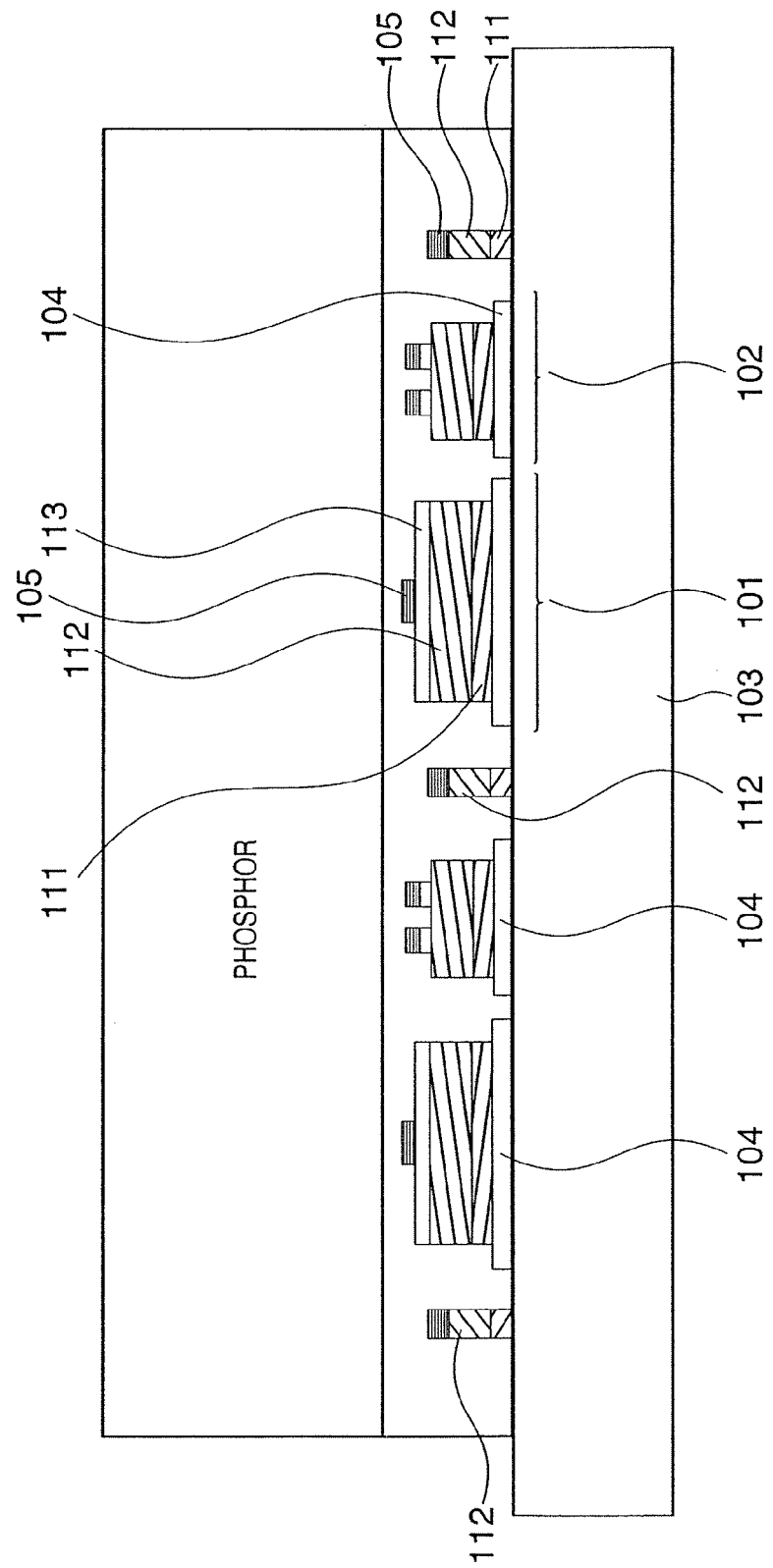
FIG. 13 is a sectional view taken along the line I-I in FIG. 12.

FIG. 3 is an equivalent circuit diagram showing the arrangement of one pixel of the X-ray imaging apparatus according to the first embodiment of the present invention. One pixel includes one photoelectric conversion device and one switching device (TFT). The planar structure and sectional structure of the photoelectric conversion device are the same as those shown in FIGS. 12 and 13. FIG. 3 represents that the photoelectric conversion device has a capacitive component $C_1$ of the i layer which serves as a semiconductor photoelectric conversion layer and is formed from amorphous silicon hydride or the like, and a capacitive component $C_{SiN}$ of the insulating layer (injection blocking layer against carriers of two conductivities) which is formed from amorphous silicon nitride or the like.

When the photoelectric conversion device reaches the saturation state, that is, no electric field exists between the D electrode and a node N (i layer), or the electric field exists but is very small, electrons and holes created by light recombine with each other, and no hole can be stored at the junction (node N in FIG. 3) between the i layer and the insulating layer. That is, the potential of the node N does not become higher than that of the D electrode. In order to embody operation in the saturation state, FIG. 3 represents that a diode (D1) is parallel-connected to the capacitive component $C_1$. In FIG. 3, the photoelectric conversion device is represented by the three components $C_1$, CSiN, and D1, and corresponds to each of the photoelectric conversion devices S1-1 to S3-3 in FIG. 2.

In FIG. 3, reference symbol TFT denotes a thin film transistor serving as a switching device, and corresponds to each of the switching devices T1-1 to T3-3 in FIG. 2. Reference symbol $C_2$ denotes a read capacitance added to a signal wiring line, but is not shown in FIG. 2. Reference symbol F1 denotes a wavelength conversion phosphor which converts the wavelength of X-rays into that of the visible region, and is arranged at a position in direct or indirect contact with the TFT. The base material of the phosphor is $Gd_2O_2$, $Gd_2O_3$, or the like, and the luminescent center uses a material containing ions of a rare-earth element such as $Tb^{3+}$ or $EU^{3+}$. A phosphor using CsI such as CsI:Tl or CsI:Na as a base material may also be employed.

A switch SW-B switches a voltage to be applied to the TFT via the gate wiring lines G1 to G3, and is arranged in the shift register SR1 shown in FIG. 2. A switch SW-C resets a read capacitance $C_2$ to the GND potential, and is controlled by an RC (CRES) signal. The switch SW-C corresponds to each of the switches RES1 to RES3 in FIG. 2. Vg(on) (=Vcom) is a power supply for turning on the TFT, reading out signal charges, and transferring them to the read capacitance $C_2$, whereas Vg(off) is a power supply for turning off the TFT.

Figure 4:
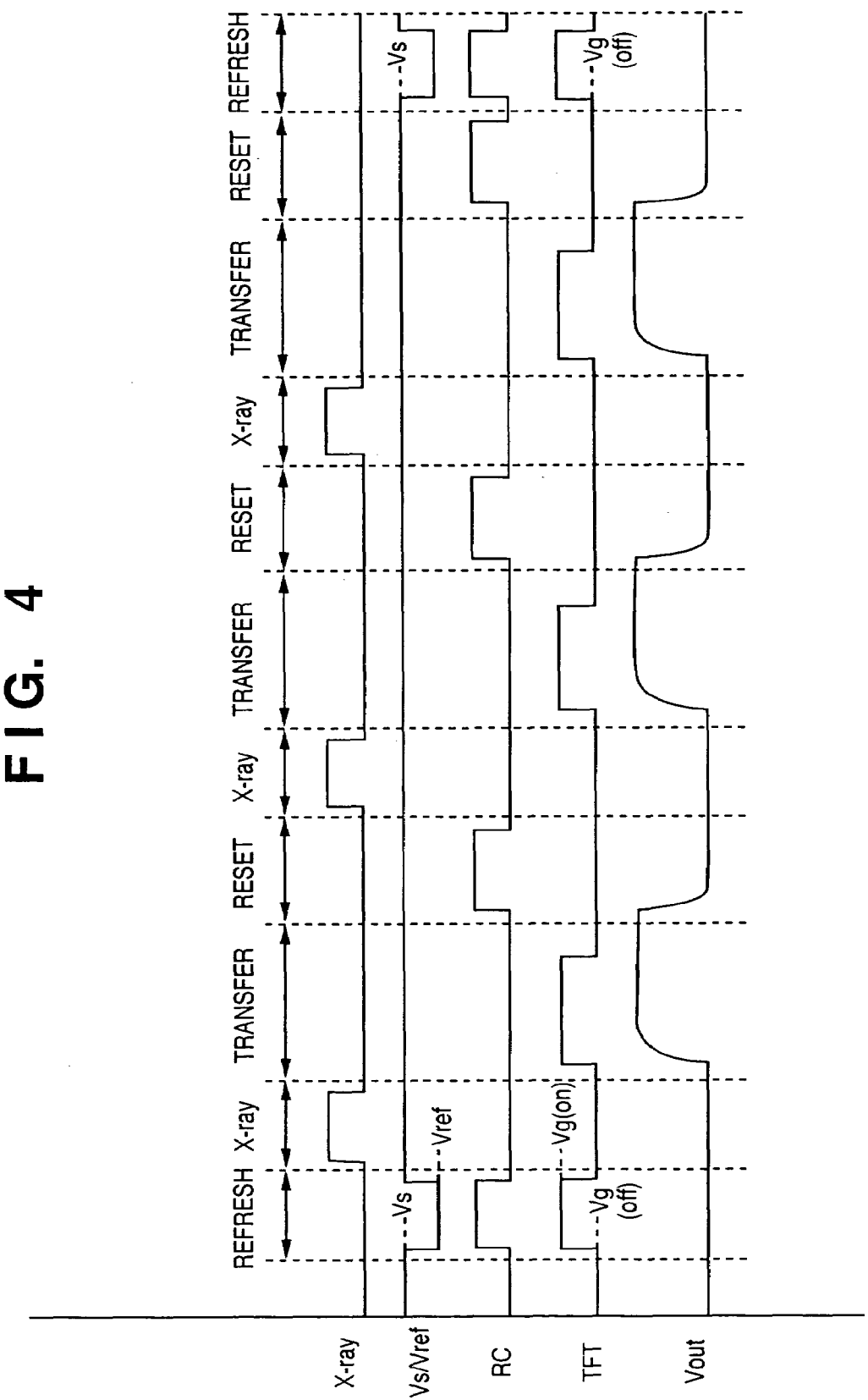
FIG. 4 is a timing chart showing circuit operation of one pixel.

Circuit operation of one pixel shown in FIG. 3 will be explained with reference to FIGS. 3 and 4. FIG. 4 is a timing chart showing circuit operation of one pixel. This circuit operation includes refresh operation, X-ray irradiation operation, transfer operation, and reset operation. The refresh period, X-ray irradiation period, transfer period, and reset period are set in correspondence with these operations.

The refresh period will now be explained. In refresh operation, a switch SW-A is switched to the Vref side, the switch SW-B is switched to the Vg(on) side, and the switch SW-C is turned on. In this state, the D electrode is biased to a 3-V Vref, the G electrode is biased to the GND potential, and the node N is biased to Vref (3 V) at maximum. "Maximum" means the following situation: if the potential of the node N has already reached Vref or more by photoelectric conversion operation preceding to refresh operation, the node N is biased to Vref via the diode D1. If, on the contrary, the potential of the node N is Vref or less by photoelectric conversion operation preceding to refresh operation, the node N is not biased to the potential Vref by refresh operation. In practical use, the node N is substantially biased to Vref (3 V) by repeating refresh operation after photoelectric conversion operation a sufficient number of times.

This refresh operation sweeps hole carriers stored at the node N of the photoelectric conversion device to the D electrode side. In the refresh period, the switch SW-A is switched to the Vs side after the node N is biased to Vref. Accordingly, the D electrode is biased to Vs (9 V).

The relationship between refresh operation and the saturation amount of the photoelectric conversion device will be described. Note that the capacitance of the capacitive component $C_1$ formed from the i layer and the capacitance of the capacitive component $C_{SiN}$ formed from the injection blocking layer are determined by the structure, and in this case, they are equal to each other. When the voltage of a node D is changed from Vs (9 V) to Vref (3 V) while the node G is kept at GND, the voltage of the node N reaches 3 V at maximum, as described above. After that, the voltage of the node D is switched from Vref (3 V) to Vs (9 V), and then a difference voltage of 6 V between Vs and Vref is applied between the node D and the node G. Also, a voltage (3 V) which is half of 6 V is applied between the node D and the node N in accordance with the capacitance ratio (in this case 1:1) of $C_1$ and $C_{SiN}$. As a result, the voltages of the nodes D, N, and G become 9 V, 6 V, and 0 V on the final stage of refresh operation, and the saturation amount of the i layer of the photoelectric conversion device becomes 9 V−6 V=3 V. That is, the minimum value of the saturation amount of the photoelectric conversion device is 3 V. If the voltage of the node N does not reach 3 V as a result of changing the voltage of the node D from Vs (9 V) to Vref (3 V), the saturation amount of the photoelectric conversion device exceeds 3 V. Vs and Vref are voltages applied from outside the photoelectric conversion device array. By adjusting this voltage to increase the saturation amount, the sequential imaging count can be increased.

The X-ray irradiation period will be explained. In X-ray irradiation operation, the switch SW-A is switched to the Vs side, the switch SW-B is switched to the Vg (off) side, and the switch SW-C is turned off. X-rays are emitted like pulses, as shown in FIG. 4. X-rays having passed through an object irradiate the phosphor F1, and are converted into visible light. Visible light traveling from the phosphor irradiates the semiconductor layer (i layer), and is photoelectrically converted. Holes created by photoelectric conversion are stored in the interface between the i layer and the insulating layer (injection blocking layer) to raise the potential of the node N. Since the TFT is OFF, the potential of the G electrode side also rises by the same amount.

The transfer period will be described. In transfer operation, the switch SW-A is switched to the Vs side, the switch SW-B is switched to the Vg(on) side, and the switch SW-C is turned off. Consequently, the TFT is turned on. Electrons corresponding in number to holes stored upon X-ray irradiation flow from the read capacitance $C_2$ to the G electrode via the TFT, and the potential of the read capacitance $C_2$ rises along with this. At this time, the number (Sh) of holes and the number (Se) of electrons satisfy $Se=Sh\times C_{SiN}/(C_{SiN}+C_1)$. The potential of the read capacitance $C_2$ is simultaneously amplified and output via the amplifier. The TFT is kept on for a time enough to satisfactorily transfer signal charges, and then turned off.

Reset operation will be explained. In reset operation, the switch SW-A is switched to the Vs side, the switch SW-B is switched to the Vg (off) side, and the switch SW-C is turned on. Consequently, the read capacitance $C_2$ is reset to the GND potential to prepare for next X-ray irradiation.

In this manner, one image is acquired. Although not shown, whether to perform refresh operation is determined after the end of the reset period. In the timing chart shown in FIG. 4, a cycle of X-ray irradiation operation, transfer operation, and reset operation is further executed twice, acquiring a total of three images. In determination after acquiring the first and second images, it is determined not to perform refresh operation. In determination after acquiring three images, it is determined to perform refresh operation. By executing refresh operation, the saturation amount of the photoelectric conversion device is initialized. Determination of whether to perform refresh operation will be described later. Note that the conventional radiographic apparatus always executes refresh operation after acquiring one image, without determining whether to perform refresh operation.

Figure 5:
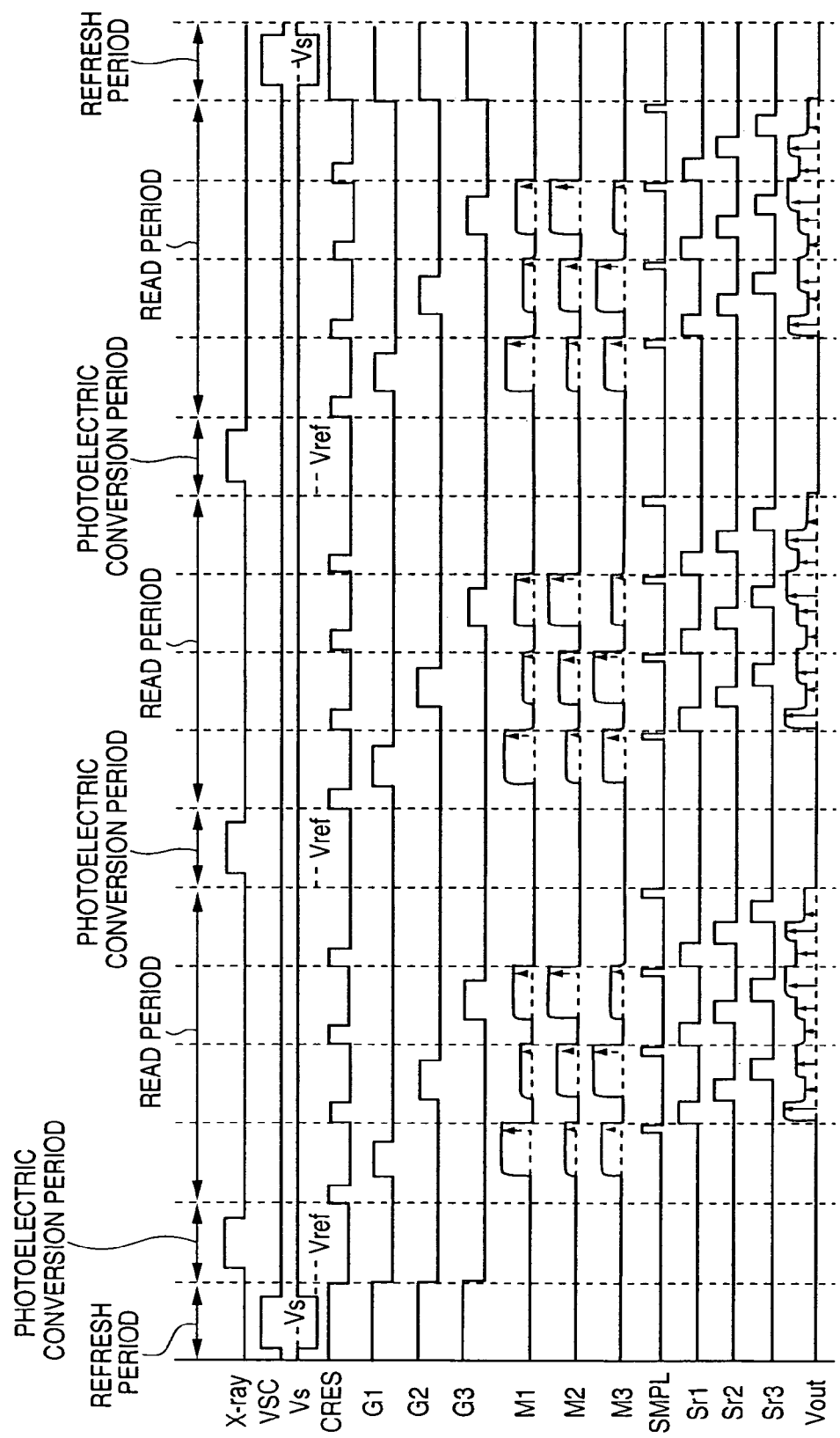
FIG. 5 is a timing chart showing the operation of a photoelectric conversion device.

The operation of the photoelectric conversion device shown in FIG. 2 will be explained with reference to FIGS. 2 and 5. FIG. 5 is a timing chart showing the operation of the photoelectric conversion device.

The operation during the refresh period will be described. In the refresh period, all signals in the shift register SR1 are set to "Hi", and the CRES signal of the read circuit unit 202 is set to "Hi". This corresponds to switching of the switch SW-B to the Vg (off) side and ON operation of the switch SW-C in the circuit of one pixel shown in FIG. 3. As a result, all the switching TFTs (T1-1 to T3-3) are turned on, the switching devices RES1 to RES3 within the read circuit unit 202 are also turned on, and the G electrodes of the photoelectric conversion devices S1-1 to S3-3 change to the GND potential. When the control signal VSC is set to "Hi", the D electrodes of all the photoelectric conversion devices are biased to the refresh power supply Vref (negative potential). Thus, all the photoelectric conversion devices S1-1 to S3-3 enter the refresh mode and are refreshed.

The photoelectric conversion period will be described. In the photoelectric conversion period, the control signal VSC is switched to "Lo". This corresponds to switching of the switch SW-A to the Vs side in the circuit of one pixel shown in FIG. 3. Accordingly, the D electrodes of all the photoelectric conversion devices S1-1 to S3-3 are biased to the read power supply Vs (positive potential), and the photoelectric conversion devices enter the photoelectric conversion mode.

Then, all the signals of the shift register SR1 are changed to "Lo", and the CRES signal of the read circuit unit 202 is changed to "Lo". As a result, all the switching TFTs (T1-1 to T3-3) are turned off, the switching devices RES1 to RES3 within the read circuit unit 202 are also turned off, and the G electrodes of the photoelectric conversion devices S1-1 to S3-3 is set open for the DC current. However, the photoelectric conversion devices also function as capacitances, and hold the potential. At this time, no light (X-rays) enters the photoelectric conversion devices, and no charge is created, i.e., no current flows.

When the light source is turned on like pulses, the D electrodes (N⁺ electrodes) of the photoelectric conversion devices are irradiated with light, and a so-called photocurrent flows. The photocurrent which flows in response to light is stored as charges in the photoelectric conversion devices, and held even after the light source is turned off. Note that the light source is not particularly illustrated in FIG. 2, but is literally an X-ray source for the X-ray imaging apparatus. In this case, an X-ray-to-visible conversion scintillator is adopted. The present invention can also be applied to an imaging apparatus other than the X-ray imaging apparatus, and the light source upon application to a copying machine is a fluorescent light, LED, halogen light, or the like.

The read period will be explained. The read period also includes the reset period shown in FIG. 4. In the read period, read is done in an order of the photoelectric conversion devices S1-1 to S1-3 on the first row, the photoelectric conversion devices S2-1 to S2-3 on the second row, and the photoelectric conversion devices S3-1 to S3-3 on the third row. In order to read from the photoelectric conversion devices S1-1 to S1-3 on the first row, a gate pulse is applied from the shift register SR1 to the gate wiring line G1 of the switching devices (TFTs) T1-1 to T1-3. The high level of the gate pulse is the externally applied voltage Vcom, as described above. As a result, the switching devices T1-1 to T1-3 are turned on, and signal charges stored in the photoelectric conversion devices S1-1 to S1-3 are transferred to the signal wiring lines M1 to M3. The signal charges transferred to the signal wiring lines M1 to M3 are amplified by the amplifiers A1 to A3. Although not shown in FIG. 2, read capacitances are added to the signal wiring lines M1 to M3, and signal charges are transferred to the read capacitances via the TFTs. For example, a read capacitance added to the signal wiring line M1 is a total of (three) capacitances (Cgs) between the gate and source electrodes of TFTs which constitute the switching devices T1-1 to T3-1 connected to the signal wiring line M1. The total capacitance corresponds to the read capacitance $C_2$ in FIG. 3.

The SMPL signal is enabled and transferred to the sample-and-hold capacitances CL1 to CL3, and then the SMPL signal is disabled and held. Pulses are applied from the shift register SR2 to the switches Sr1, Sr2, and Sr3 in an order named, and the signals held by the sample-and-hold capacitances CL1 to CL3 are output as Vout from the amplifier Ab to the A/D conversion circuit unit 203 in an order of the sample-and-hold capacitances CL1, CL2, and CL3. Consequently, photoelectrically converted signals from one row of the photoelectric conversion devices S1-1, S1-2, and S1-3 are sequentially output. The CRES signal is enabled simultaneously when a pulse is applied from the shift register SR2 to the switch Sr1, thereby resetting the signal wiring lines M1 to M3 to the GND potential. This corresponds to ON operation (reset period) of the switch SW-C in the circuit of one pixel shown in FIG. 3.

After the signal wiring lines M1 to M3 are reset to the GND potential, a gate pulse is applied from the shift register SR1 to the gate wiring line G2 of the switching devices (TFTS) T2-1 to T2-3 in order to read from the photoelectric conversion devices S2-1 to S2-3 on the second row. In this way, read operation of the photoelectric conversion devices S2-1 to S2-3 on the second row and read operation of the photoelectric conversion devices S3-1 to S3-3 on the third row are successively executed. By sampling and holding the signals of the signal wiring lines M1 to M3 in the sample-and-hold capacitances CL1 to CL3, signal charges in the photoelectric conversion devices S2-1 to S2-3 and S3-1 to S3-3 on the second and third rows can be transferred using the shift register SR1 while serial conversion operation of signals from the first and second rows is done using the shift register SR2.

By the above operation, signal charges of all the photoelectric conversion devices on the first to third rows can be output, acquiring one still image. In order to acquire a succeeding moving image, a cycle of the photoelectric conversion period and read period (including the reset period) is further repeated twice without performing refresh operation, acquiring a total of three image data. After the first and second still images are acquired, whether to perform refresh operation (to be described later) is determined. In this case, the result of not performing refresh operation is obtained.

Figure 6:
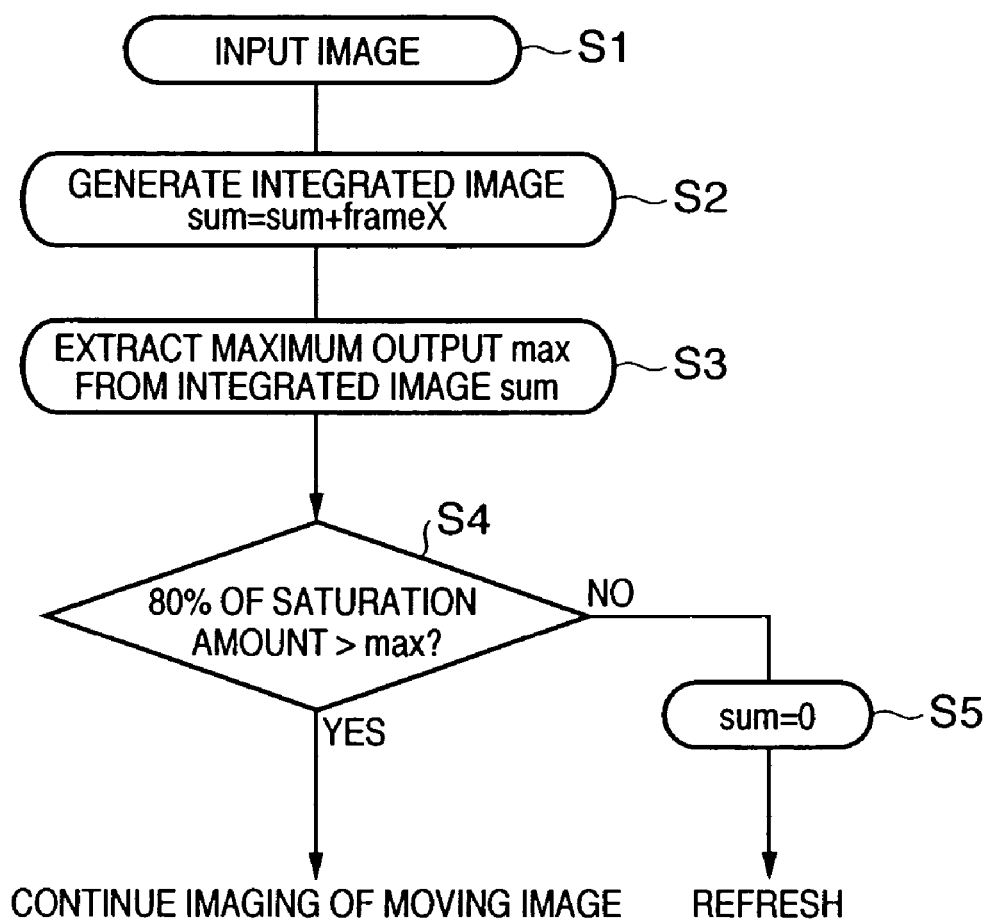
FIG. 6 is a flowchart showing a method in which an image processor 204 determines whether to execute refresh in the first embodiment.
Figures 7A, 7B, 7C:
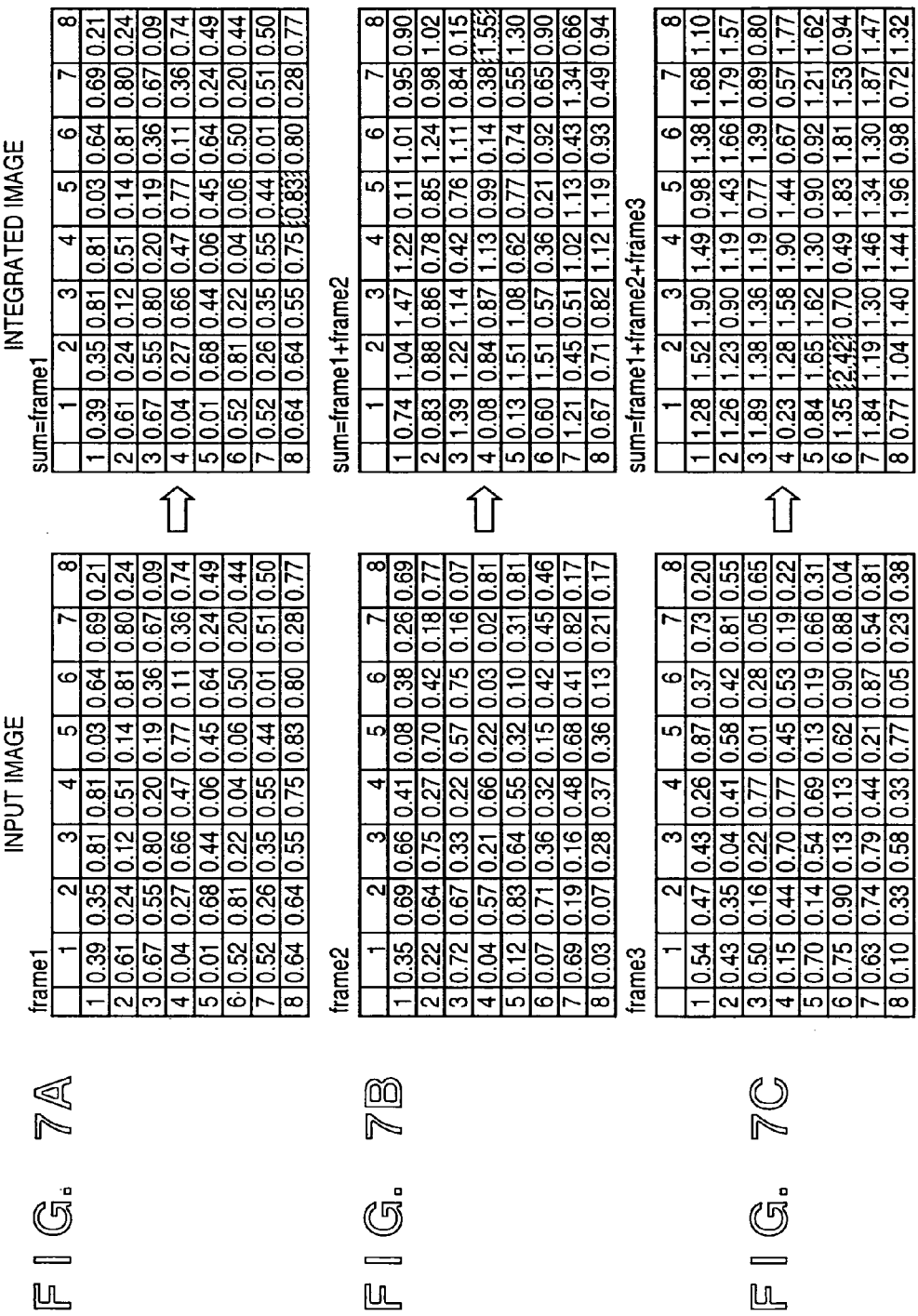
FIGS. 7A to 7C are tables showing an example of image data input to the image processor 204 and the progress of the process in the first embodiment.

Determination of whether to perform refresh operation will be explained. This determination is executed by, e.g., the image processor 204. FIG. 6 is a flowchart showing a method in which the image processor 204 determines whether to execute refresh in the first embodiment. FIGS. 7A to 7C are tables showing an example of image data output from the A/D conversion unit 203 to the image processor 204 and the progress of the process in the first embodiment when the photoelectric conversion device shown in FIGS. 1 to 3 is driven in accordance with the timing chart shown in FIG. 5. The numerical values in FIGS. 7A to 7C are given in volt. FIG. 2 shows the layout of 3×3 pixels, but FIGS. 7A to 7C show an expanded layout of 8×8 pixels.

If image data is input to the image processor 204 (step S1), the image processor 204 generates an integrated image sum (step S2). When image data of frame 1 is input, no integrated data has existed, and "integrated image sum=frame 1". Hence, actual integration is done from frame 2.

The image processor 204 extracts a maximum output max from the integrated image sum (step S3). Then, the image processor 204 compares the maximum output max with a preset threshold (step S4). In this case, the threshold is 80% of the saturation amount, and when the saturation amount is 3 V, as described above, the threshold is 2.4 V. If the maximum output max is smaller than the threshold, imaging continues. If the maximum output max is equal to or larger than the threshold, the integrated image sum is cleared to 0 (step S5), and refresh operation is performed.

If image data shown in FIG. 7 is actually obtained (step S), "integrated image sum=frame 1" (step S2). In extraction of the maximum value max for frame 1 (step S3), 0.83 V (data of a pixel hatched at the periphery in FIG. 7A) is extracted. In comparison with the threshold (step S4), the threshold (2.4 V)>max (0.83 V), and imaging of a moving image continues without performing refresh operation.

If image data of frame 2 is input (step S1), "integrated image sum=frame 1+frame 2". In extraction of the maximum value max for frame 2 (step S3), 1.55 V is extracted. In comparison with the threshold (step S4), the threshold (2.4 V)>max (1.55 V), and imaging of a moving image continues again.

If image data of frame 3 is input (step S1), "integrated image sum=frame 1+frame 2+frame 3". In extraction of the maximum value max for frame 3 (step S3), 2.42 V is extracted. In comparison with the threshold (step S4), the threshold (2.4 V)≦max (2.42 V), the integrated image sum is cleared to 0 (step S5), and then refresh operation is executed.

Note that the threshold need not be 80% of the saturation amount, and can be properly set in accordance with the radiation dose (image output) per image.

Figure 8:
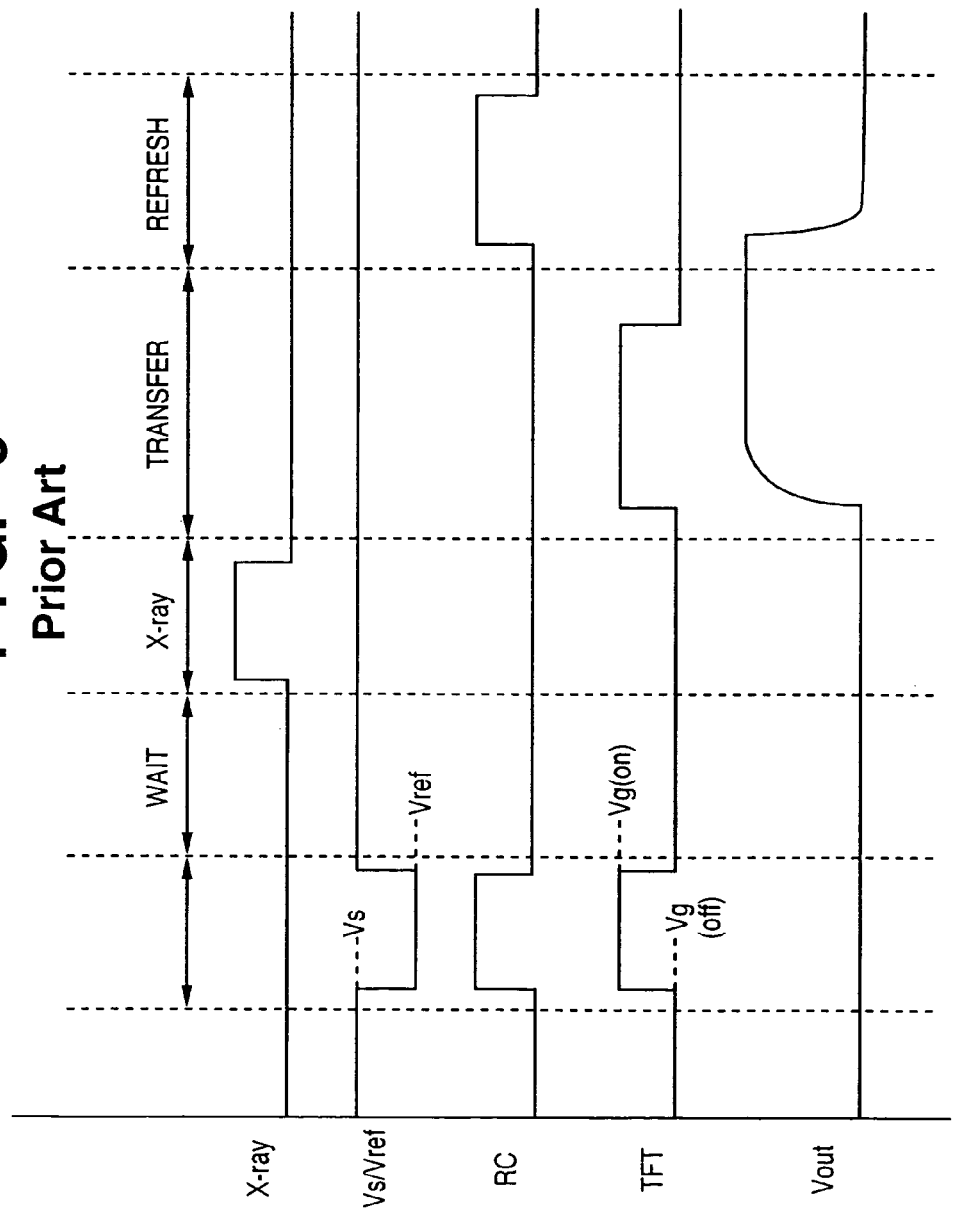
FIG. 8 is a timing chart showing the operation of a conventional photoelectric conversion device.

In this fashion, the first embodiment can reduce three refresh operations for three imaging operations performed in the conventional radiographic apparatus to one refresh operation by generating an integrated image and comparing its maximum value with a threshold set on the basis of the saturation amount. The wait time can be shortened in correspondence with the number of omitted refresh operations, increasing the frame frequency. As shown in FIG. 8, the conventional radiographic apparatus requires the refresh period every imaging, and also requires the accompanying wait time, decreasing the frame frequency. To the contrary, the first embodiment can reduce the frequency at which refresh is executed, and can increase the frame frequency.

Figure 14A:
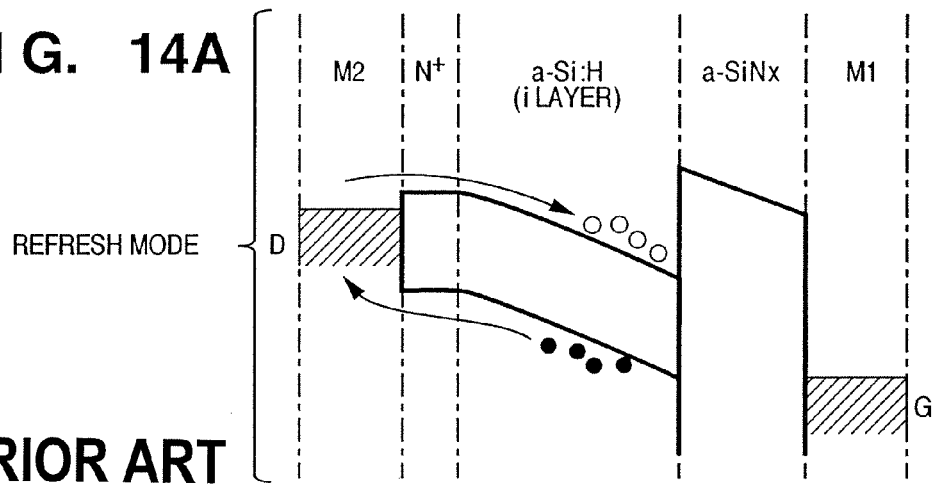
FIGS. 14A to 14C are energy band diagrams showing device operation of the photoelectric conversion device shown in FIGS. 12 and 13.
Figure 14B:
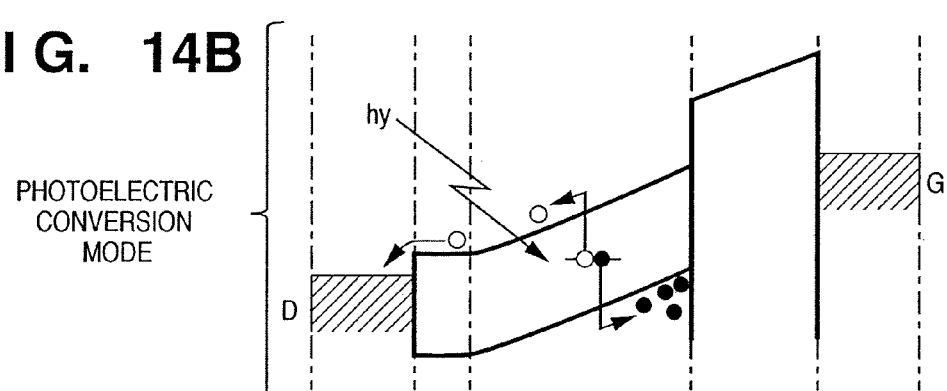
Figure 14C:
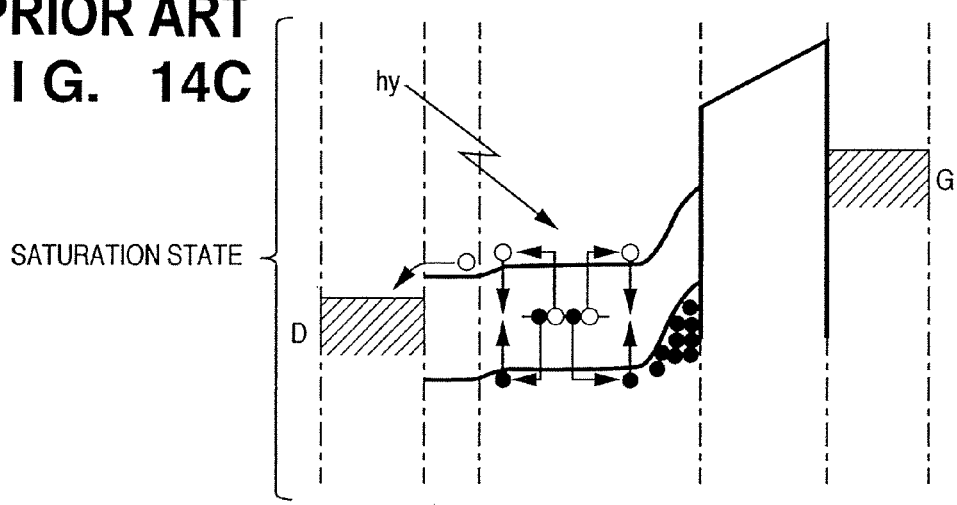

Although it is ideal to sweep all holes when holes within the i layer are swept in the refresh mode, even sweeping of some holes can provide a sufficient current. It suffices that the i layer is not in a saturation state as shown in FIG. 14C in a detection occasion in the next photoelectric conversion mode. The potential of the D electrode to the G electrode in the refresh mode, the period of the refresh mode, and the characteristics of the injection blocking layer of the N$^+$ layer are so determined as to satisfy the above condition. Further, injection of electrons into the i layer is not a requirement in the refresh mode, and the potential of the D electrode to the G electrode is not limited to a negative potential. This is because, when many holes stay in the i layer, the electric field within the i layer is added to a direction to which holes are guided to the D electrode even if the potential of the D electrode to the G electrode is positive. Similarly, injection of electrons into the i layer is not a requirement for the characteristics of the N$^+$ layer serving as the injection blocking layer.

Second Embodiment

Figure 9:
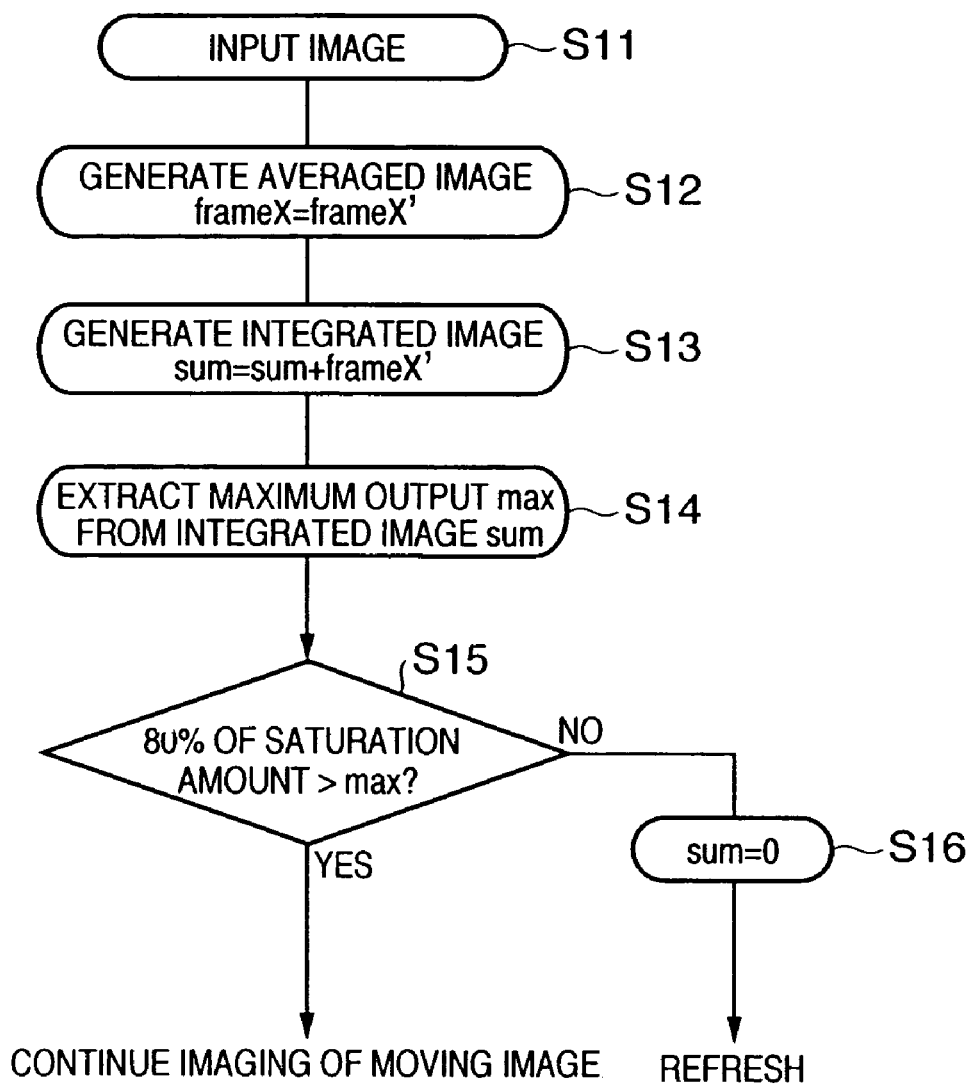
FIG. 9 is a flowchart showing a method in which an image processor 204 determines whether to execute refresh in the second embodiment.

The second embodiment of the present invention will be described. The second embodiment is different from the first embodiment in the method in which the image processor 204 determines whether to perform refresh operation. FIG. 9 is a flowchart showing the method in which an image processor 204 determines whether to execute refresh in the second embodiment. FIGS. 10A to 10C are tables showing an example of image data output from an A/D conversion unit 203 to the image processor 204 and the progress of the process in the second embodiment. Note that FIG. 2 shows the layout of 3×3 pixels, but FIGS. 10A to 10C show an expanded layout of 8×8 pixels, similar to the first embodiment.

In the second embodiment, if image data is input to the image processor 204 (step S11), the image processor 204 converts 8×8 image data into 4×4 image data by averaging image data (step S12). More specifically, the average of 2×2 upper left pixels having addresses of (x=1, y=1) to (x=2, y=2) out of 8×8 image data is calculated and stored at the upper left address (x'=1, y'=1) of newly created 4×4 image data. Similarly, the average of 2×2 image data having addresses of (x=1, y=3) to (x=2, y=4) is calculated and stored at (x'=1, y'=2) of the 4×4 image data. This process is done for all the 8×8 pixel data. With this process, a noise component is removed from input image data, obtaining more accurate image data.

Thereafter, similar to the first embodiment, generation of an integrated image (step S13), extraction of the maximum output max (step S14), and comparison with the threshold and determination (step S15) are performed using the 4×4 image data after the averaging process. If a frame exceeding the threshold appears, the integrated image sum is cleared to 0, and refresh operation is executed.

If image data shown in FIG. 10A is actually obtained (step S11), the average (0.66) of the four pixels ((x=1, y=1) to (x=2, y=2)) and the like are sequentially calculated in the averaging process (step S12) for frame 1, and the 8×8 pixel data frame 1 is converted into 4×4 pixel data frame 1' (step S12). "Integrated image sum=frame 1'" (step S13), and 0.97 V is extracted in extraction of the maximum value max (step S14) for the next frame 1'. In comparison with the threshold (step S15), the threshold (2.4 V)>max (0.97 V), and imaging of a moving image continues without performing refresh operation.

As shown in FIG. 10B, the same process is done for frame 2. In the process for frame 3 shown in FIG. 10C, the threshold (2.4 V)≦max (2.41 V) in step S15, the integrated image sum is cleared to 0 (step S16), and then refresh operation is executed.

According to the second embodiment, even if a pixel whose single pixel data stands out owing to, e.g., noise exists, the pixel is averaged, and subsequent extraction of the maximum output is stably done. Note that the method of the averaging process is not limited to one described in the second embodiment, and any method can be employed as far as noise can be reduced.

Third Embodiment

Figure 11A:
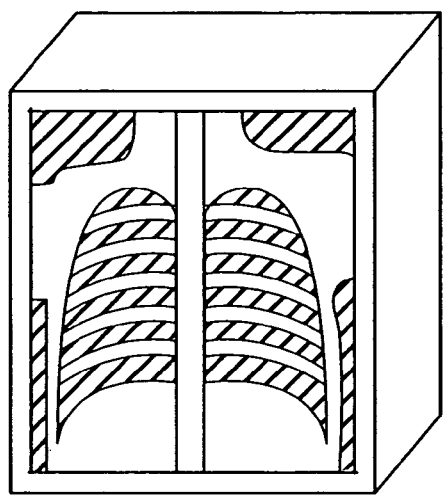
FIGS. 11A to 11C are schematic views showing the operation of an X-ray imaging apparatus according to the third embodiment of the present invention.
Figure 11B:
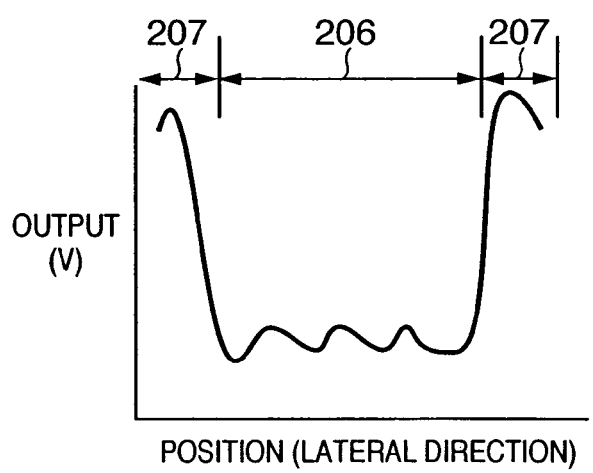
Figure 11C:
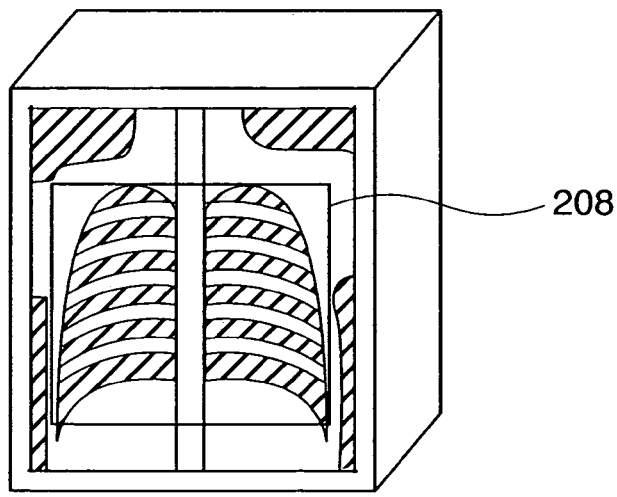

The third embodiment of the present invention will be described. The first and second embodiments perform a process using all pixel data output from the photoelectric conversion device. The third embodiment allows the user to arbitrarily select a region necessary to determine refresh. FIGS. 11A to 11C are schematic views showing the operation of an X-ray imaging apparatus according to the third embodiment of the present invention.

When the chest of a human body undergoes X-ray imaging, an image as shown in FIG. 11A is displayed on a display 205. For this image, outputs in the lateral direction at the center are plotted to obtain a graph as shown in FIG. 11B. As shown in FIG. 11B, an output at a graph center 206 is low, and an output at a periphery 207 is high because of the following reason. The graph center 206 corresponds to an output of X-rays having passed through the imaged chest of the human body, and X-rays are absorbed by the chest of the human body, decreasing the amount of X-rays incident on a photoelectric conversion circuit unit 201. To the contrary, the periphery 207 does not have any absorber in comparison with the graph center 206 and is transparent to X-rays, and a large amount of X-rays are directly incident on the photoelectric conversion device. A portion the radiographer requires for actual diagnosis is a portion at the graph center 206 at which X-rays are absorbed by the chest and the output is low. A portion at the periphery 207 at which the output is high is an area unnecessary for diagnosis.

If the maximum output value is extracted from the whole image in determining refresh of the photoelectric conversion device, a value obtained from the periphery 207 as the non-object region exhibiting a high output is extracted, and it may be determined to perform refresh though the center 206 actually used for diagnosis still has a large detectable remaining amount with respect to the saturation amount of the photoelectric conversion device.

In this situation, the third embodiment allows the user to arbitrarily select a region used for determination of refresh by the radiographer, and a diagnosis area 208 corresponding to the graph center 206 can be selected, as shown in FIG. 1C. By this selection, the maximum output value is extracted from the diagnosis area 208, and determination of refresh is executed. Hence, no refresh is unnecessarily performed, the number of refresh operations is further decreased, and a moving image having a higher frame frequency can be obtained.

The embodiments of the present invention can be realized by, e.g., executing a program by a computer. A unit for supplying a program to a computer, for example, a computer-readable recording medium (e.g., a CD-ROM) which records the program or a transmission medium (e.g., the Internet) which transmits the program can also be applied as an embodiment of the present invention. The program can also be applied as an embodiment of the present invention. The program, recording medium, transmission medium, and program product fall within the scope of the present invention.

As many apparently widely different embodiments of the present invention can be made without departing from the spirit and scope thereof, it is to be understood that the invention is not limited to the specific embodiments thereof except as defined in the claims.

CLAIMS OF PRIORITY

This application claims priority from Japanese Patent Application No. 2004-071171 filed on Mar. 12, 2004, which is hereby incorporated by reference herein.

What is claimed is:

1. A radiographic apparatus comprising:
a photoelectric conversion device array in which a plurality of pixels are arrayed on a substrate, wherein each of the pixels includes at least a photoelectric conversion device, and wherein said photoelectric conversion device array can be reset in a reset operation, and said photoelectric conversion can be initialized in a refresh operation and can generate a signal in a photoelectric conversion operation; and
a processor configured to determine whether to perform the refresh operation on the basis of image data acquired by the signals output from said photoelectric conversion device array,
wherein said processor does not perform the refresh operation after the photoelectric conversion operation when determining not to perform the refresh operation, performs the refresh operation after the photoelectric conversion operation when determining to perform the refresh operation, and performs the reset operation after the photoelectric conversion operation regardless of whether the refresh operation is performed or not.

2. The apparatus according to claim 1, wherein integrated data is obtained by integrating the image data acquired by n (n≧1) frames, a maximum output value is extracted from the integrated data for a single pixel or a plurality of pixels, and the refresh operation is performed in accordance with the maximum output value.

3. The apparatus according to claim 1, wherein a pixel, which outputs pixel data and is referred to in performing the refresh operation, can be designated by a user.

4. The apparatus according to claim 1, wherein amorphous silicon is used as materials of said photoelectric conversion device and a switching device.

5. The apparatus according to claim 4, wherein said photoelectric conversion devices and said switching device are formed on the substrate.

6. The apparatus according to claim 1, further comprising a wavelength converter which converts a wavelength of radiation, wherein a wave output upon wavelength conversion by said wavelength converter enters said photoelectric conversion device.

7. The apparatus according to claim 1, wherein said photoelectric conversion device creates electron-hole pairs upon incidence of light, and the refresh operation is an operation to sweep one of the electron or the hole remaining in said photoelectric conversion devices, and the refresh operation is performed when said processor determines that the refresh operation should be performed.

8. A radiographic system comprising:
a radiation source which irradiates an object with radiation;
a radiographic apparatus according to claim 1 that detects radiation that has passed through the object;
an image processing unit for performing an image processing on the image data acquired by said radiographic apparatus; and
a display unit for displaying the image data processed by said image processing unit.

9. A method of controlling a radiographic apparatus having a photoelectric conversion device away in which a plurality of pixels are arrayed on a substrate, wherein each of the pixels includes at least a photoelectric conversion device, and wherein the photoelectric conversion device array can be reset in a reset operation, and said photoelectric conversion device can be initialized in a refresh operation and can generate a signal in a photoelectric conversion operation, said method comprising steps of:
determining whether to perform the refresh operation on the basis of the image data acquired by the signals output from the photoelectric conversion device array, and
not performing the refresh operation after the photoelectric conversion operation when determining not to perform the refresh operation in said step of determining, performing the refresh operation after the photoelectric conversion operation when determining to perform the refresh operation in said step of determining, and performing the reset operation after the photoelectric conversion operation regardless of whether the refresh operation is performed or not.

10. The method according to claim 9, wherein, in said step of determining, integrated data is obtained by integrating the image data acquired by n (n≧1) frames, a maximum output value is extracted from the integrated data for a single pixel or a plurality of pixels, and whether to perform the refresh operation is determined in accordance with whether the maximum output value is larger than a threshold value.

11. A computer-readable storage medium storing a computer program for causing a computer to control a radiographic apparatus having a photoelectric conversion device away in which a plurality of pixels are arrayed on a substrate, wherein each of the pixels includes at least a photoelectric conversion device, and wherein the photoelectric conversion device array can be reset in a reset operation, and said photoelectric conversion device can be initialized in a refresh operation and can generate a signal in a photoelectric conversion operation, wherein the program causes the computer to execute the method of claim 9.

12. A computer-readable storage medium storing a computer program for causing a computer to control a radiographic apparatus having a photoelectric conversion device array in which a plurality of pixels are arrayed on a substrate, wherein each of the pixels includes at least a photoelectric conversion device, and wherein the photoelectric conversion device array can be reset in a reset operation, and said photoelectric conversion device can be initialized in a refresh operation and can generate a signal in a photoelectric conversion operation, wherein the program causes the computer to execute the method of claim 10.

13. The apparatus according to claim 1, wherein the apparatus performs the imaging operation comprising the photoelectric conversion operation and a read operation for outputting the signals from said photoelectric conversion device array.

* * * * *